(12) United States Patent
Wu et al.

(10) Patent No.: US 9,581,915 B2
(45) Date of Patent: Feb. 28, 2017

(54) PHOTOLITHOGRAPHIC METHOD

(75) Inventors: Qiang Wu, Beijing (CN); Yao Xu, Beijing (CN)

(73) Assignee: Semiconductor Manufacturing International (Beijing) Corporation (CN)

( * ) Notice: Subject to any disclaimer, the term of this patent is extended or adjusted under 35 U.S.C. 154(b) by 0 days.

(21) Appl. No.: 13/405,233

(22) Filed: Feb. 25, 2012

(65) Prior Publication Data

US 2013/0084532 A1 Apr. 4, 2013

(30) Foreign Application Priority Data

Sep. 29, 2011 (CN) .................. 2011 1 10300889

(51) Int. Cl.
| | | |
|---|---|---|
| *G03F 7/028* | (2006.01) | |
| *G03F 7/20* | (2006.01) | |
| *G03F 7/004* | (2006.01) | |
| *G03F 7/038* | (2006.01) | |
| *G03F 7/039* | (2006.01) | |

(52) U.S. Cl.
CPC ........ *G03F 7/70466* (2013.01); *G03F 7/0045* (2013.01); *G03F 7/0046* (2013.01); *G03F 7/0382* (2013.01); *G03F 7/0392* (2013.01); *G03F 7/203* (2013.01); *G03F 7/2022* (2013.01); *G03F 7/70575* (2013.01)

(58) Field of Classification Search
CPC ....... G03F 7/039; G03F 7/0392; G03F 7/2022
See application file for complete search history.

(56) References Cited

U.S. PATENT DOCUMENTS

| | | | | |
|---|---|---|---|---|
| 6,045,968 A | * | 4/2000 | Ushirogouchi et al. | ... 430/270.1 |
| 6,887,653 B2 | * | 5/2005 | Richter et al. | ................ 430/322 |
| 6,936,401 B2 | * | 8/2005 | Endo et al. | ................ 430/270.1 |
| 7,297,464 B2 | * | 11/2007 | Sakurai et al. | ............ 430/270.1 |
| 2001/0003034 A1 | | 6/2001 | Furukawa et al. | |
| 2002/0160318 A1 | | 10/2002 | Richter et al. | |
| 2011/0008729 A1 | * | 1/2011 | Bae et al. | .................. 430/270.1 |

FOREIGN PATENT DOCUMENTS

| | | |
|---|---|---|
| CN | 101405655 A | 4/2009 |
| CN | 101638388 A | 2/2010 |

* cited by examiner

*Primary Examiner* — Daborah Chacko Davis
(74) *Attorney, Agent, or Firm* — Innovation Counsel LLP

(57) ABSTRACT

A method for performing photolithography using a photo-resist is disclosed. The photo-resist comprises a first component and a second component. The method includes providing a substrate having a surface coated with the photo-resist and selectively illuminating a region of the surface of the photo-resist using light in a first wavelength band. The method further includes illuminating the entire surface of the photo-resist using light in a second wavelength band. The first and second wavelength bands are different and may not overlap. The method also includes performing a development process for the photo-resist upon illumination with the light of the first and second wavelength bands.

11 Claims, 7 Drawing Sheets

PHOTOLITHOGRAPHIC METHOD

CROSS-REFERENCES TO RELATED APPLICATIONS

This application claims priority to Chinese Patent Application No. 201110300889.1, filed on Sep. 29, 2011 and entitled "Photolithographic Method", which is incorporated herein by reference in its entirety.

This patent application is related to the following co-pending, commonly assigned patent applications, the disclosures of which are incorporated herein by reference in their entirety:
1. "Photo-Resist and Method of Photolithography" by Qiang Wu and Yiming Gu, U.S. patent application Ser. No. 13/405,235 filed on Feb. 25, 2012.
2. "Photolithographic Apparatus" by Qiang Wu and Yiming Gu, U.S. patent application Ser. No. 13/405,238 filed on Feb. 25, 2012, now U.S. Pat. No. 8,982,314.

BACKGROUND OF THE INVENTION

Field of the Invention

The present invention relates generally to a photolithographic method using a photo-resist, and more specifically, to a photolithographic method using a chemically amplified photo-resist.

Description of the Related Art

With the rapid development of the microelectronic industry, critical dimensions of a semiconductor device continue to shrink. The shrinkage of the critical dimensions of a device depends on exposure tools. The shrinkage is also closely related to the selection of a photo-resist. Thus, the selection and application of a photo-resist corresponding to photolithography also become an important research content for photolithographic processes.

The advancement of photolithography promotes the steady improvement in performances of a photo-resist. The photo-resist using a chemical amplification action has many advantages such as high sensitivity and strong ability to withstand dry corrosion, which facilitate the subsequent processing process of the semiconductor. A chemically amplified photo-resist has thus a broader application prospect in the semiconductor manufacturing field and gradually gains attention in the photolithographic field. It is believed that a chemically amplified photo-resist with its steady processing properties will play an important role in the semiconductor industry.

A chemically amplified photo-resist generally comprises three components: a matrix resin, an organic solvent, and a photoacid generator (PAG) for producing a chemical amplification action. After the chemically amplified photo-resist has been exposed to or illuminated with light, the PAG absorbs energy and undergoes a photolysis. Thus, free acid is generated, which results in an acid catalytic reaction such that exposed portions of the matrix resin will undergo a removal reaction of protecting groups or a cross-linking reaction between resin and cross linker, forming positive or negative latent images which are then subjected to development in a certain solvent to form exposure images. In addition, some chemically amplified photo-resist may employ a photobase generator (PBG) instead of a photoacid generator. An alkaline catalytic reaction takes place with the help of photobase, which likewise results in that the matrix resin undergoes a removal reaction of protecting groups or a cross-linking reaction between resin and cross linker, forming a positive or negative latent image.

However, the contrast of the latent image will be degraded due to following factors: One factor is photoacid diffusion. The photoacid generated by illumination with a light in a first wavelength band will gradually diffuses from a position of high mass concentration to a position of low mass concentration through free movement of molecules. In this way, the mass concentration distribution of the photoacid will depart from the optical image, thereby degrading the contrast of the latent image of the photoacid.

The other factor is photo diffraction. Theoretically, an optical image formed by means of a mask should be a simple binary image, that is, in the optical image, the light intensity of a portion of the image where the light is shielded by the mask is zero, while the light intensity of the other part of the image where the light transmits through the mask is a constant. However, with the continuous shrinkage of the critical dimensions for semiconductor processes, light diffraction effect becomes more and more evident, such that the portion of the optical image that should have a light intensity of zero also has certain light intensity. As a result, the contrast of the latent image of the photoacid is further degraded.

In the prior art, a diffusion length or depth is restricted to enhance the contrast of a latent image. However, the restriction method is disadvantageous since it will make the removal reaction or the cross-linking reaction less efficient. Besides, the conventional method also fails to overcome the degradation of the contrast of a latent image caused by the diffraction effect.

BRIEF SUMMARY OF THE INVENTION

The inventor of the present invention has found that the conventional art has numerous problems, and proposes novel technical solutions to address at least one of the problems.

An embodiment of the present invention is to provide a method for performing photolithography using a photo-resist. The method for performing photolithography employs a photo-resist that comprises a matrix resin, a first component for producing a chemical amplification action, and a second component. The first component is capable of generating a first chemical substance under the illumination of light in a first wavelength band, and the first chemical substance is capable of reacting with the matrix resin to form a latent image. The second component is capable of generating a second chemical substance under the illumination of light in a second wavelength band, wherein the second chemical substance is capable of reacting with the first chemical substance, thereby reducing a mass concentration of the first chemical substance. The method includes providing a substrate having a surface coated with the photo-resist, and selectively illuminating a region of a surface of the photo-resist using the light in the first wavelength band, thereby generating the first chemical substance in the photo-resist. The first chemical substance has a certain mass concentration distribution in the photo-resist. The method also includes uniformly illuminating the entire surface of the photo-resist using the light in the second wavelength band, thereby generating the second chemical substance in the photo-resist. The second chemical substance has a mass concentration that is uniformly distributed in the photo-resist, and the mass concentration of the second chemical substance is larger than a minimum value of the mass concentration of the first chemical substance. The method further includes performing a development process for the photo-resist, thereby forming a desired photo-resist pattern.

In an embodiment, the light in the first wavelength band has an amount of energy from 0.1 to 100 mJ/cm².

In an embodiment, the light in the second wavelength band has an amount of energy from 0.1 to 100 mJ/cm².

In an embodiment, the step of illuminating using the light in the first wavelength band and the step of illuminating using the light in the second wavelength band are substantially performed at a same time.

In an embodiment, the first component is a photoacid generator and the first chemical substance is a photoacid; and the second component is a photobase generator and the second chemical substance is a photobase.

In an embodiment, the photoacid generator is (4-tert-butylphenyl) diphenylsulphonium triflate or triphenylsulphonium triflate.

In an embodiment, the photobase generator is a quaternary ammonium salt.

In an embodiment, the photoacid generator has a mass concentration ranging from 1% to 30%.

In an embodiment, the photobase generator has a mass concentration ranging from 0.1% to 20%.

In an embodiment, the matrix resin is polyhydroxystyrene or polyacrylates.

In an embodiment, the photobase has a diffusion length of 5 to 80 nm.

In an embodiment, the step of selectively illuminating a region of a surface of said photo-resist may comprise using a mask.

The present invention provides an advantage that some photoacid is neutralized by photobase, thereby enhancing the contrast of latent images.

Further features of the present invention and advantages thereof will become apparent from the following detailed description of exemplary embodiments according to the present invention with reference to the accompanying drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

The present invention can be more clearly understood based on the following detailed description with reference to accompanying drawings, in which.

DETAILED DESCRIPTION OF THE INVENTION

Figure 1:
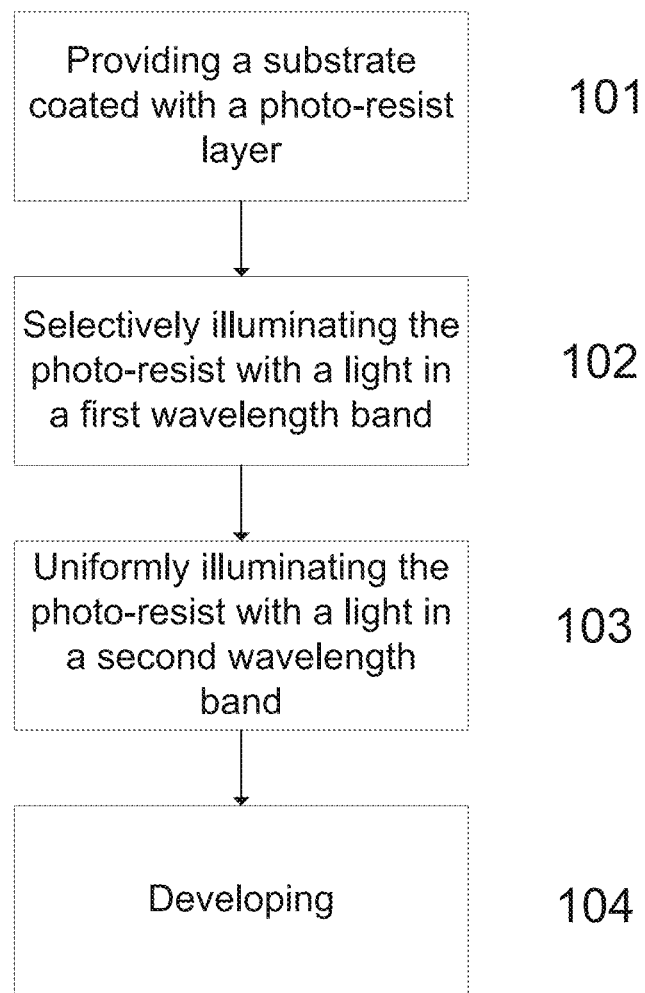
FIG. 1 is a flowchart illustrating a method for performing photolithography using a photo-resist according to an embodiment of the present invention.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

Meanwhile, it should be understood that, for the convenience of description, each component in the figures has not been necessarily drawn to scale.

The following description of at least one exemplary embodiment is merely illustrative in nature and is in no way intended to limit the invention, its application, or uses.

Techniques, methods and apparatus as known by one of ordinary skill in the relevant art may not be described in detail but are intended to be part of the specification where appropriate.

In all of the examples illustrated and described herein, any specific values should be interpreted to be illustrative only and non-limiting. Thus, other examples of the exemplary embodiments could have different values.

Notice that similar reference numerals and letters refer to similar items in the figures, and thus once a component is defined in one figure, it will not be further defined in following figures.

The present invention provides a photo-resist that comprises a matrix resin, a first component for producing chemical amplification action, wherein the first component is capable of generating a first chemical substance under the illumination of a light in a first wavelength band, and the first chemical substance is capable of reacting with the matrix resin to form a latent image; and a second component that is capable of generating a second chemical substance under the illumination of a light in a second wavelength band. The second chemical substance is capable of reacting with the first chemical substance, thereby reducing a mass concentration of the first chemical substance in the photo-resist.

The present invention also provides a method for performing photolithography using the aforementioned photo-resist. The method comprises providing a substrate having a surface coated with the photo-resist, selectively illuminating a region of a surface of the photo-resist using a light in a first wavelength band to generating a first chemical substance in the photo-resist. The first chemical substance has a certain mass concentration distribution in the photo-resist. The method further includes uniformly illuminating the entire surface of the photo-resist using light in a second wavelength band to generate a second chemical substance in the photo-resist. The second chemical substance has a mass concentration that is uniformly distributed in the photo-resist, and the mass concentration of the second chemical substance is larger than a minimum value of the mass concentration of the first chemical substance. The method also includes performing a development process for the photo-resist to form a desired photo-resist pattern.

An embodiment of the present invention provides a photo-resist that comprises a photoacid generator (PAG), a photobase generator (PBG), a matrix resin and an organic solvent.

In an example embodiment, polyhydroxystyrene or polyacrylates can be used for the matrix resin. For the organic solvent, various solvents as commonly known in the art can be employed, the description thereof will be omitted for the sake of brevity. In this exemplary photo-resist, the photoacid generator is sensitive to the light in a first wavelength band. When the light in a first wavelength band is used to illuminate the photo-resist, it will absorb the light energy and undergo a photolysis to generate a photoacid. The resin in the photo-resist will undergo, for example, a removal reaction, under the action with photoacid, thereby causing the resin in the exposure region to go through a removal reaction of protecting groups. The photoacid generator can be, for example, (4-tert-butylphenyl) diphenylsulphonium triflate, triphenylsulphonium triflate, or the like. In an embodiment, the photoacid generators has a mass concentration ranging from 1% to 30% in the photo-resist.

The photobase generator in the above described photo-resist is sensitive to light in a second wavelength band. When illuminated by the light in the second wavelength band, the photobase generator absorbs light energy and undergoes a photolysis to generate a photobase. In an embodiment, the first wavelength band is substantially different from the second wavelength band. The photobase generator can be, for example, one or more quaternary ammonium salts. According to the different mass concentration of the photoacid generator, the mass concentration of the photobase generator can be selected from a range of 0.1% to 20%.

Below, in conjunction with FIGS. 1 through 10, a method for perform photolithography using the photo-resist described above will be further provided.

As shown in FIG. 1, the method for performing photolithography using the photo-resist according to an embodiment comprises the following steps:
(1) Providing a substrate having a surface coated with the photo-resist (step 101). For example, a layer of photo-resist 203 is uniformly coated over the surface of substrate 204 as needed.
(2) Selectively illuminating a selected region of the surface of the photo-resist using the light in the first wavelength band (step 102), such that the photoacid generator in the photo-resist is decomposed to photoacid. The photoacid has a certain mass concentration distribution at various regions of the photo-resist.
(3) Uniformly illuminating the entire surface of the photo-resist using a light in the second wavelength band (step 103).
(4) Performing development process for the photo-resist, thereby forming the desired photo-resist pattern (step 104).

The above sequence of processes provides a method according to an embodiment of the present invention. Other alternatives can also be provided where processes are added, one or more processes are removed without departing from the scope of the claims herein.

Figure 2:
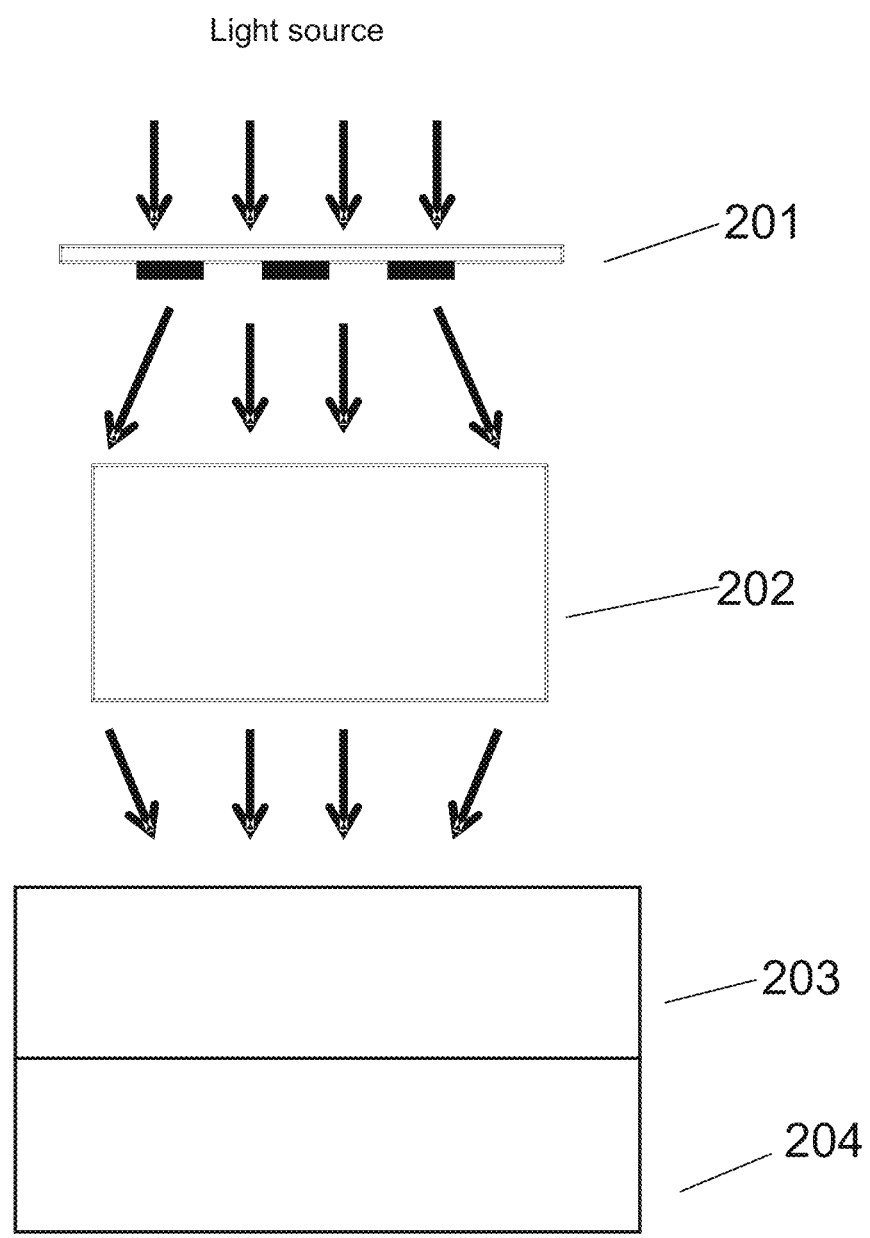
FIG. 2 is a diagram illustrating the exposure of a photo-resist using light in a first wavelength band according to an embodiment of the present invention.

As shown in FIG. 2, an optical pattern is formed by light in a first wavelength band that is emitted from a light source and has passed through a mask 201. Then, the optical pattern is projected onto the surface of photo-resist 203 by means of an exposure optical element 202.

The photoacid generator in the photo-resist undergoes a photolysis due to the absorption of the light in the first wavelength band, thereby generating photoacid in the photo-resist. One of ordinary skill in the art would appreciate that, the mass concentration of the generated photoacid is related to parameters such as the amount of energy of the light in the first wavelength band and the mass concentration of the photoacid generator. In an embodiment, the light in the first wavelength band has an amount of energy from 0.1 to 100 $mJ/cm^2$. In this manner, the optical image is converted into a latent image of the photoacid.

In an ideal situation, the higher the contrast of the latent image of the photoacid, the better, because, in this way, the photo-resist pattern formed after development will have a relatively small edge roughness. However, due to photoacid diffusion as well as optical diffraction of mask 201, the contrast of the latent image will be degraded.

Figure 3:
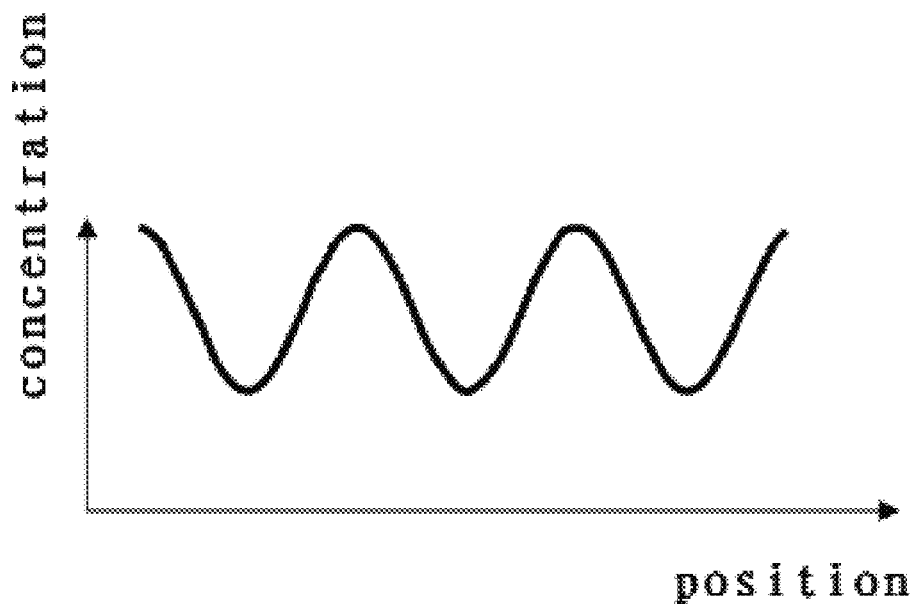
FIG. 3 shows a distribution curve of the mass concentration of the photoacid generated in the photo-resist according to an embodiment of the present invention.

FIG. 3 shows a distribution curve of the mass concentration of the photoacid generated in the photo-resist. As shown in FIG. 3, the mass concentration of the photoacid is greater than zero at any position, that is to say, photoacid exists even in regions which are illuminated by the light in the first wavelength band. Herein, one of ordinary skill in the art should appreciate that the mass concentration of the photoacid at any position refers to a ratio between the mass of the photoacid generated in an infinitesimal of the photo-resist and the mass of the infinitesimal of the photo-resist at this position.

Figure 4:
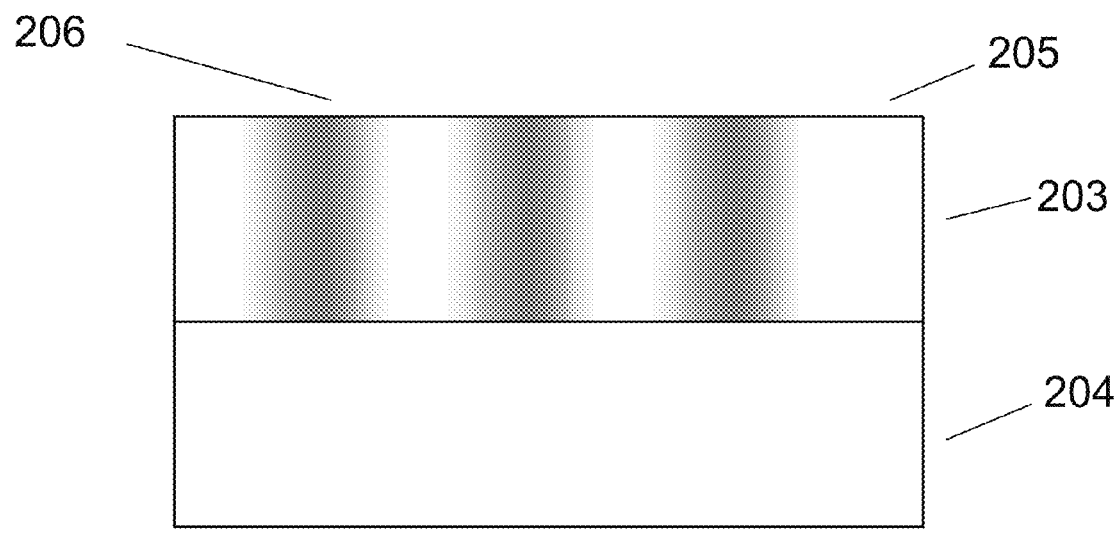
FIG. 4 is a diagram illustrating the mass concentration distribution of the photoacid generated in the photo-resist according to an embodiment of the present invention.

FIG. 4 illustrates the distribution of the photoacid in the photo-resist. As shown in FIG. 4, dark regions 206 indicate positions which are shielded by mask 201, and the mass concentration of the photoacid in dark regions 206 is low; whereas white regions 205 indicate positions which are directly illuminated by the light in the first wavelength band, and the mass concentration of the photoacid in white regions 205 is high. Corresponding to the distribution curve of the mass concentration of the photoacid of FIG. 3, as the photoacid mass concentration gradually decreases from a maximum value to a minimum value, in photo-resist 203, white regions 205 gradually transits to dark regions 206. Due to the influence of photoacid diffusion and diffraction of the mask as mentioned above, the transitional region between dark region 206 and white region 205 is relatively indistinct, that is, the contrast of the latent image of the photoacid is relatively low. One of ordinary skill in the art should appreciate that, the minimum value of the mass concentration of the photoacid as mentioned herein refers to a minimum value of the mass concentration in all the regions of the photo-resist, for example, this non-zero minimum value usually appears in dark region 206.

Figure 5:
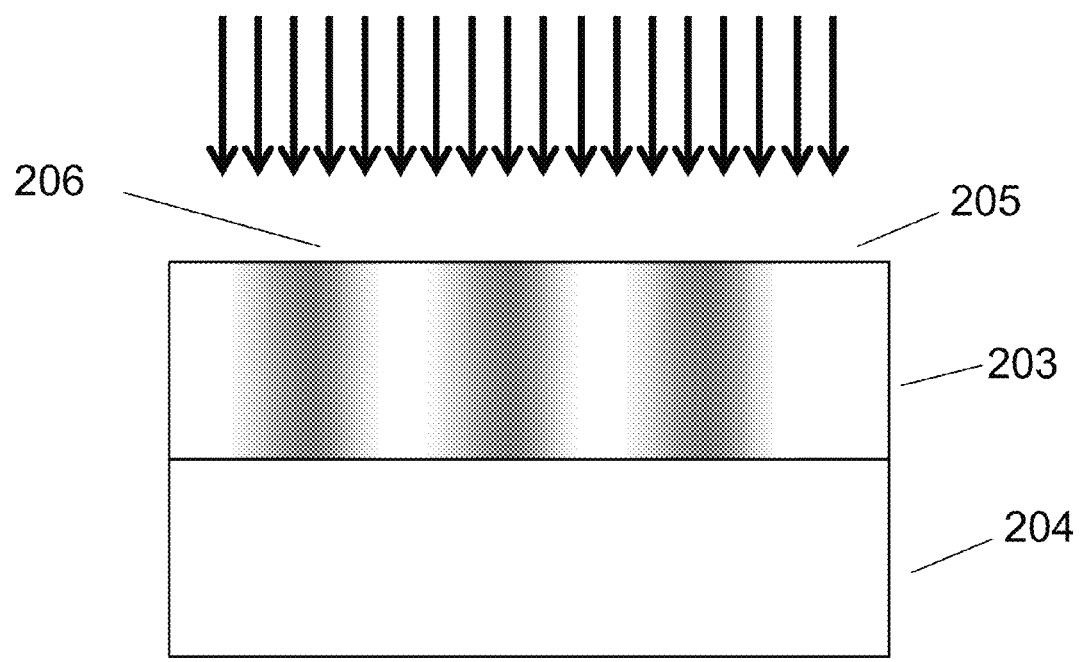
FIG. 5 is a diagram illustrating illumination of a photo-resist using light in a second wavelength band according to an embodiment of the present invention.
Figure 6:
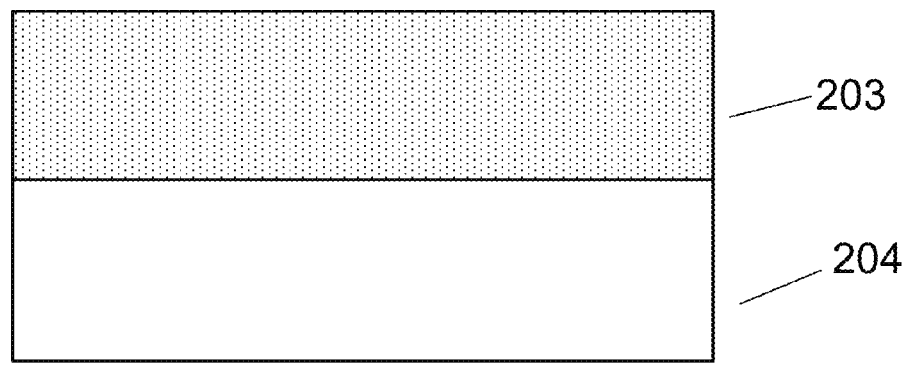
FIG. 6 is a diagram illustrating the mass concentration distribution of the photobase generated in the photo-resist according to an embodiment of the present invention.
Figure 7A:
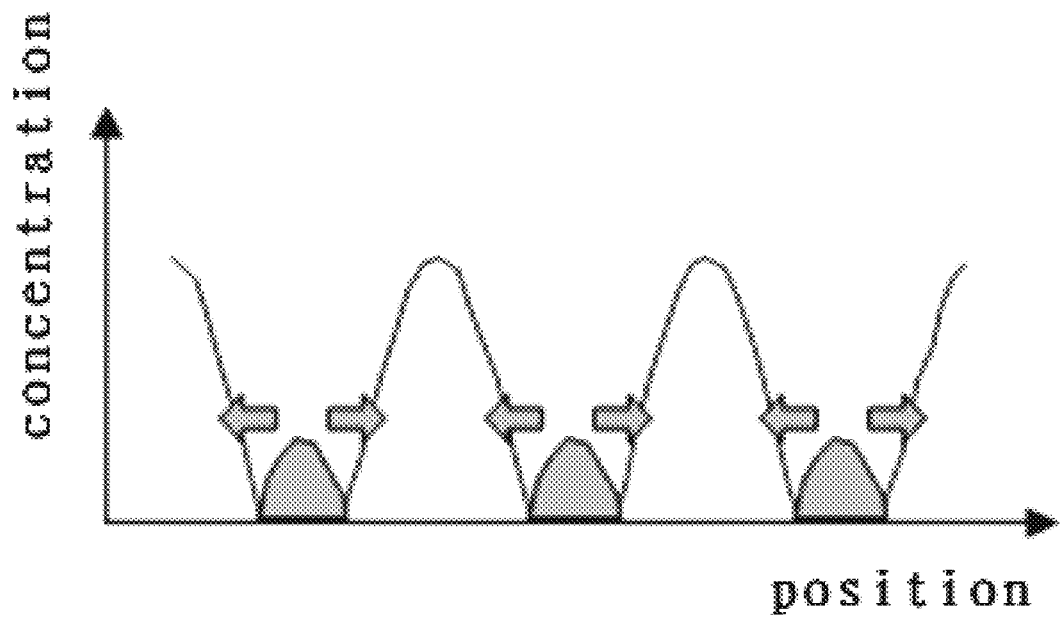
FIGS. 7A and 7B respectively illustrate a distribution curve of the mass concentration of the photoacid and the photobase in the photo-resist, after a neutralization reaction between the photoacid and the photobase, according to an embodiment of the present invention.
Figure 7B:
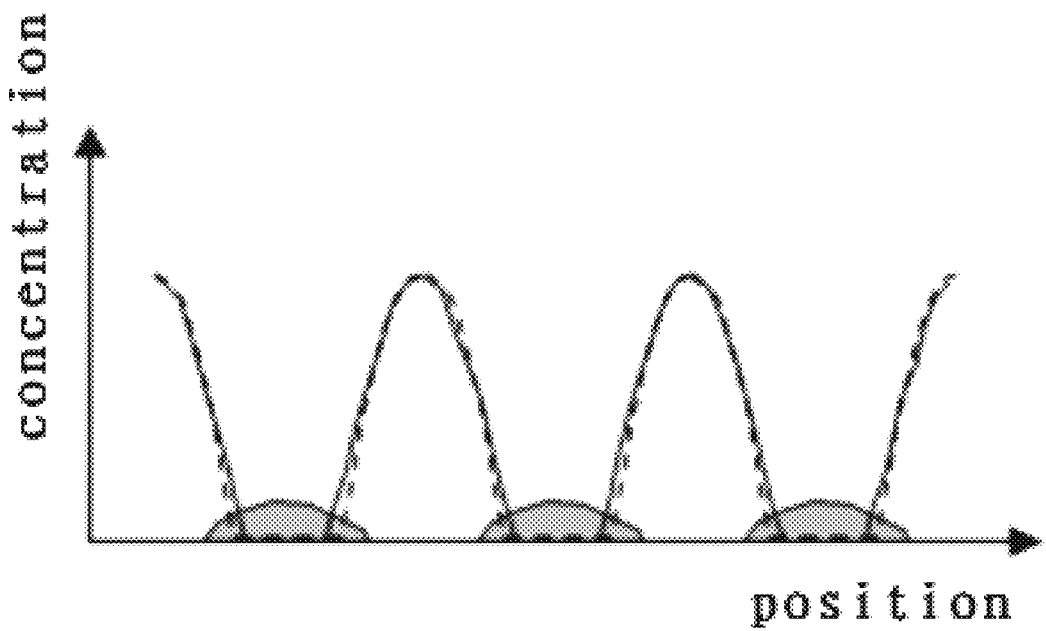

At process step 103, the entire surface of the photo-resist is illuminated using a light in the second wavelength band. As shown in FIG. 5, light in the second wavelength band uniformly illuminates the surface of the photo-resist. Since the photobase generator in the photo-resist 203 is sensitive to the light in the second wavelength band, the photobase of a uniform mass concentration will be generated in the photo-resist 203, as shown in FIG. 6. The mass concentration of the photobase can be controlled by controlling parameters such as the amount of energy of the light in the second wavelength band and the mass concentration of the photobase generator, such that the mass concentration of photobase is larger than the minimum value of the mass concentration of the photoacid. In this embodiment, the light in the second wavelength band can have an amount of energy, for example, from 0.1 to 100 mJ/cm². Moreover, when the mass concentration of the photobase is larger than the minimum value of the mass concentration of the photoacid, the photobase in the photo-resist will not only neutralize all the photoacid in dark region 206, but there will be some photobase still remaining in dark region 206. As shown in FIGS. 7A and 7B, the photobase remaining in dark region 206 will diffuse into other regions. By controlling the diffusion length of the photobase within 5 to 80 nm, for example, the gradient of the mass concentration of the photoacid in the photo-resist can become larger, that is, the contrast of the latent image of the photoacid becomes greater. One of ordinary skill in the art would understand that the photobase diffusion is associated with its molecular weight. That is, the larger the molecular weight of the photobase, the more difficult the occurrence of its diffusion. In the art, a diffusion length is typically used for describing such diffusion characteristic of a matter, that is, the smaller the diffusion length is, the more difficult for its molecules to diffuse. One of ordinary skill in the art can control the diffusion length of the generated photobase by designing an appropriate photobase generator.

Figure 8:
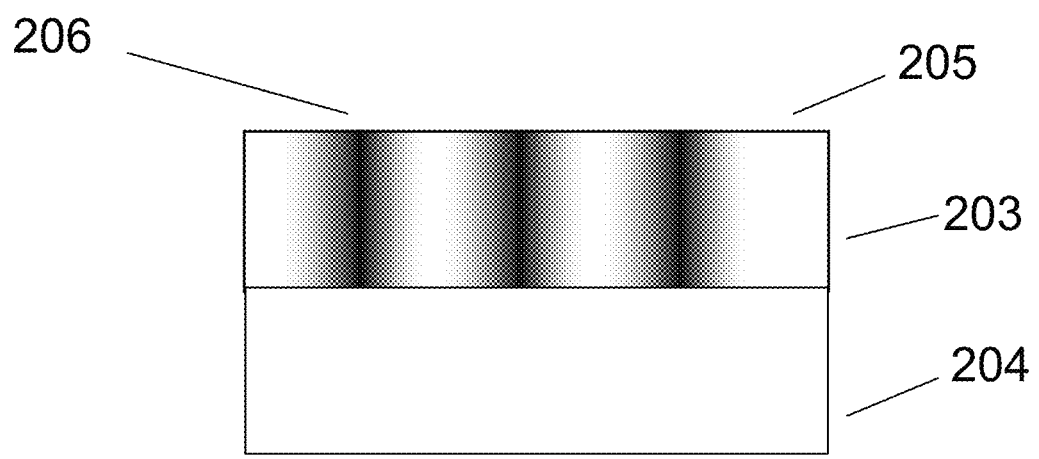
FIG. 8 is a diagram illustrating the mass concentration distribution of the photoacid in the photo-resist, after a neutralization reaction between the photoacid and the photobase, according to an embodiment of the present invention.

FIG. 8 further shows the latent image of the photoacid after the neutralization reaction. Dark regions 206 become darker, which indicates that the photoacid in dark regions 206 have been all removed through the neutralization reaction, and the diffusion of the photobase remaining in the dark region 206 raises the gradient of the mass concentration of the photoacid. Thus, the contrast of the latent image of the photoacid is enhanced.

Moreover, the step of illuminating with light in a first wavelength band and the step of illuminating with light in a second wavelength band can be performed with a certain time interval between them. Within the scope of the present invention, one of ordinary skill in the art can reasonably select such an interval. In a preferred embodiment, the two steps are performed at a same time, that is, the photo-resist is simultaneously illuminated with the light in a first wavelength band and the light in a second wavelength band. The embodiment has the advantage that the photolithographic processing can be performed at high speed and the photolithographic efficiency is enhanced.

Figure 9:
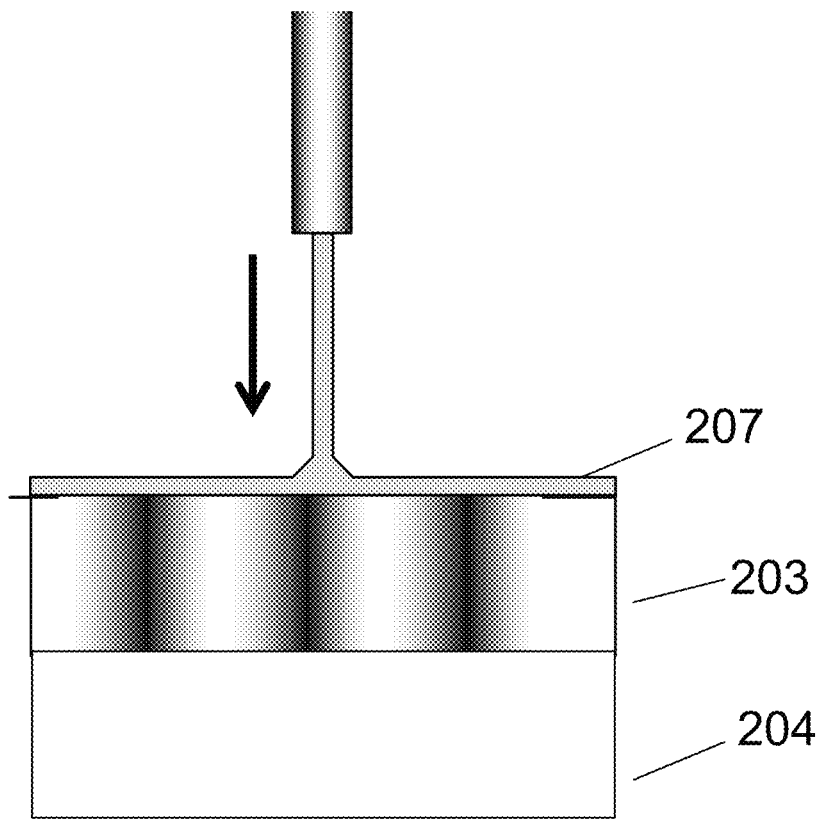
FIG. 9 is a diagram illustrating performing a development processing for the photo-resist according to an embodiment of the present invention.
Figure 10:
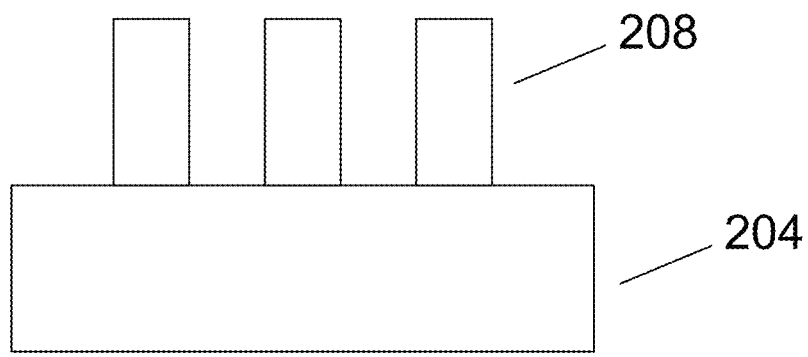
FIG. 10 is a diagram illustrating a photo-resist pattern obtained by a photolithographic method according to an embodiment of the present invention.

Referring back to FIG. 1, the method further includes performing a development process for the photo-resist, thereby forming the desired photo-resist pattern (step S104). As shown in FIG. 9, a development process is performed for photo-resist 203 using a developer 207. Regarding the exemplary positive photo-resist 203 in this embodiment, the white region (an region where the photoacid is generated) is removed while the dark region (an region without photoacid) is maintained, thereby forming a photo-resist pattern 208 as shown in FIG. 10.

In the above embodiment, since the photoacid generator and the photobase generator are sensitive to different wavelength bands, it is possible to illuminate the photo-resist using the light in different wavelength bands during the exposure process, such that the mass concentration of the photoacid and the mass concentration of the photobase in the photo-resist can be individually controlled and adjusted. Then, through a neutralization reaction between the photoacid and the photobase, and through diffusion of the photobase remaining in the dark region, the contrast of the latent image of the photoacid can be enhanced, and thus the edge roughness of the finally formed photo-resist pattern can be improved. The method of the present invention not only overcomes the adverse influence on the contrast of the latent image of the photoacid that is caused by the photoacid diffusion, but it also overcomes the degradation of the contrast of the latent image of the photoacid due to diffraction of the mask.

Of course, the photo-resist illustrated above is a positive photo-resist. One of ordinary skill in the art should appreciate that a negative photo-resist also can be obtained in the similar manner.

So far, the photo-resist according to the present invention as well as the method for performing photolithography using this photo-resist has been described above in detail. In order to not obscure the concept of the present invention, some details as known in the art are not described. One of ordinary skill in the art would know how to implement the technical solution disclosed herein based on the above description.

Although some specific embodiments of the present invention have been demonstrated in detail with examples, it should be understood by one of ordinary skill in the art that the above examples are only intended to be illustrative but not to limit the scope of the present invention. It should be understood by a person skilled in the art that the above embodiments can be modified without departing from the scope and spirit of the present invention. The scope of the present invention is defined by the attached claims.

What is claimed is:
1. A method for performing photolithography comprising:
providing a substrate having a surface coated with a photo-resist, the photo-resist comprising a matrix resin, a first component, and a second component;
selectively illuminating a first region of a surface of the photo-resist using light in a first wavelength band, thereby generating a first chemical substance in the photo-resist, wherein the first chemical substance is capable of reacting with the matrix resin to form a latent image on the photo-resist, wherein a first mass concentration of the first chemical substance is higher in the first region than in a second region of the surface of the photo-resist that is not selectively illuminated using the light in the first wavelength band;
uniformly illuminating the surface of the photo-resist including the first region and the second region using light in a second wavelength band after selectively illuminating the first region of the surface of the photo-resist using the light in the first wavelength band, thereby generating a second chemical substance in the photo-resist, wherein the second chemical substance has a second mass concentration that is uniformly distributed throughout the photo-resist, wherein the second chemical substance is capable of reacting with the first chemical substance, and the second mass concentration of the second chemical substance has a uniform value that is larger than a minimum value of the first mass concentration of the first chemical substance in the second region;
wherein, after uniformly illuminating the surface of the photo-resist using light in the second wavelength band, the first chemical substance in the second region is fully reacted by a chemical reaction with the second chemical substance in the second region such that no first chemical substance remains in the second region after the chemical reaction, and a remaining amount of the second chemical substance that has not reacted with the first chemical substance in the second region diffuses from the second region into the first region;
controlling a diffusion length of the second chemical substance from the second region to the first region by controlling an amount of energy of the light in the second wavelength band and a mass concentration of the second component in the photo-resist, thereby further reducing the first mass concentration of the first chemical substance in the first region, and increasing a gradient of the first mass concentration of the first chemical substance in the photo-resist and enhancing a contrast of the latent image;

performing a development process for the photo-resist using the enhanced latent image; and forming a desired photo-resist pattern on the substrate.

2. The method of claim 1, wherein the light in the first wavelength band has an amount of energy ranging from 0.1 to 100 mJ/cm$^2$.

3. The method of claim 1, wherein the light in the second wavelength band has an amount of energy ranging from 0.1 to 100 mJ/cm$^2$.

4. The method of claim 1, wherein the first component is a photoacid generator and the first chemical substance is a photoacid; and the second component is a photobase generator and the second chemical substance is a photobase.

5. The method of claim 4, wherein the photoacid generator is (4-tert-butylphenyl) diphenylsulphonium triflate or triphenylsulphonium triflate.

6. The method of claim 4, wherein the photobase generator is a quaternary ammonium salt.

7. The method of claim 4, wherein the first mass concentration of the photoacid ranges from 1% to 30%.

8. The method of claim 4, wherein the second mass concentration of the photobase ranges from 0.1% to 20%.

9. The method of claim 4, wherein the matrix resin includes polyhydroxystyrene or polyacrylates.

10. The method of claim 4, wherein selectively illuminating the region of the surface of the photo-resist comprises illuminating the surface of the photo-resist using a mask.

11. The method of claim 1, wherein the second component is chosen to have a molecular weight to control the diffusion length of the second chemical substance within 5 nm to 80 nm.

* * * * *